United States Patent
Fusayasu et al.

(10) Patent No.: US 10,248,166 B2
(45) Date of Patent: Apr. 2, 2019

(54) ELECTRONIC DEVICE

(71) Applicant: Panasonic Intellectual Property Management Co., Ltd., Osaka (JP)

(72) Inventors: Hirotsugu Fusayasu, Kyoto (JP); Masato Tobinaga, Hyogo (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 236 days.

(21) Appl. No.: 15/215,836

(22) Filed: Jul. 21, 2016

(65) Prior Publication Data
US 2016/0327990 A1 Nov. 10, 2016

Related U.S. Application Data

(63) Continuation of application No. PCT/JP2014/005653, filed on Nov. 11, 2014.

(30) Foreign Application Priority Data

Mar. 18, 2014 (JP) .................. 2014-054648

(51) Int. Cl.
*G06F 1/16* (2006.01)
*H05K 9/00* (2006.01)
*H04M 1/02* (2006.01)

(52) U.S. Cl.
CPC .............. *G06F 1/1656* (2013.01); *G06F 1/16* (2013.01); *H05K 9/0067* (2013.01); *H04M 1/0202* (2013.01)

(58) Field of Classification Search
CPC ....... G06F 1/1656; H05F 3/00; H05K 9/0064; H05K 9/0067; H05K 9/0079
See application file for complete search history.

(56) References Cited

U.S. PATENT DOCUMENTS 5,171,936 A * 12/1992 Suzuki ................ H05K 9/0067
174/376
2009/0059502 A1* 3/2009 Filson .................. G06F 1/1601
361/679.27

(Continued)

FOREIGN PATENT DOCUMENTS

JP 62-032596 A 2/1987
JP H04-059996 U 5/1992

(Continued)

OTHER PUBLICATIONS

International Search Report issued in Application No. PCT/JP2014/005653 dated Feb. 17, 2015, with English translation.

*Primary Examiner* — Ronald W Leja
*Assistant Examiner* — Christopher J Clark
(74) *Attorney, Agent, or Firm* — McDermott Will & Emery LLP

(57) ABSTRACT

Provided is an electronic device to which measures for reducing influence by electro-static discharge are applied. A tablet of the present disclosure includes a display module, a first metal frame that holds the display module, a second metal frame disposed on a surface opposite to a surface of the first metal frame where the display module is held, and a printed circuit board having a ground electrically connected to the first metal frame, mounting an electronic circuit, and disposed on a surface opposite to a surface of the second metal frame where the first metal frame is disposed. An electro-static current diverges to the first metal frame and the second metal frame.

4 Claims, 10 Drawing Sheets

(56) References Cited

U.S. PATENT DOCUMENTS

| | | | | |
|---|---|---|---|---|
| 2009/0291709 A1* | 11/2009 | Lee | ................... | G06F 1/1626 |
| | | | | 455/556.2 |
| 2014/0118660 A1* | 5/2014 | Zhang | ............... | G02F 1/133308 |
| | | | | 349/58 |
| 2016/0098143 A1* | 4/2016 | Kida | ................... | G06F 3/041 |
| | | | | 345/174 |

FOREIGN PATENT DOCUMENTS

| JP | H04-157799 A | 5/1992 |
|---|---|---|
| JP | H09-046080 A | 2/1997 |
| JP | 2000-340991 A | 12/2000 |
| JP | 2007-027397 A | 2/2007 |
| JP | 2009-008862 A | 1/2009 |
| JP | 2009-259874 A | 11/2009 |
| JP | 2014-007391 A | 1/2014 |

* cited by examiner

FIG. 1 – Prior Art

ELECTRONIC DEVICE

RELATED APPLICATIONS

This application is a continuation of International Application No. PCT/JP2014/005653, filed on Nov. 11, 2014, which in turn claims the benefit of Japanese Application No. 2014-054648, filed on Mar. 18, 2014, the disclosures of which are incorporated by reference herein.

BACKGROUND

1. Technical Field The present disclosure relates to an elect ionic device to which measures for reducing influence by electro-static discharge (ESD) is applied.

2. Description of Related Art

Conventionally; electro-static discharge has been a big factor causing an operational defect of an apparatus and disconnection of a network, and proper ESD measures have been required of manufacturers of an electronic device in device design.

As the ESD measures, for example, Unexamined Japanese Patent Publication No. H04-157799 has disclosed a constitution that relates to a structure of a housing to contain an electric appliance circuit, an electric device and the like, in which in a housing made of a low-resistance conductor connected to a frame earth, a surface of the housing is formed of a high-resistance conductor, an insulator is sandwiched between the high-resistance conductor and the low-resistance conductor in an inner surface. and the high-resistance conductor is connected to the frame earth.

SUMMARY

The present disclosure provides an electronic device to which measures educing influence by electro-static discharge are applied.

The electronic device in the present disclosure includes a display module, a first metal frame that holds the display module, a second metal frame disposed on a surface opposite to a surface of the first metal frame where the display module is held, and a printed circuit board having a ground electrically connected to the first metal frame, mounting an electronic circuit, and disposed on a surface opposite to a surface of the second metal frame where the first metal frame is disposed. An electro-static current diverges to the first metal frame and the second metal frame.

The electronic device in the present disclosure can reduce influence by the electro-static discharge. Particularly, the electronic device is effective to reduction of the influence by the electro-static discharge in a tablet type electronic device (hereinafter, a tablet) in which reduction in thickness and increase in size of a screen have been advanced.

DESCRIPTION OF EMBODIMENTS

Figure 1:
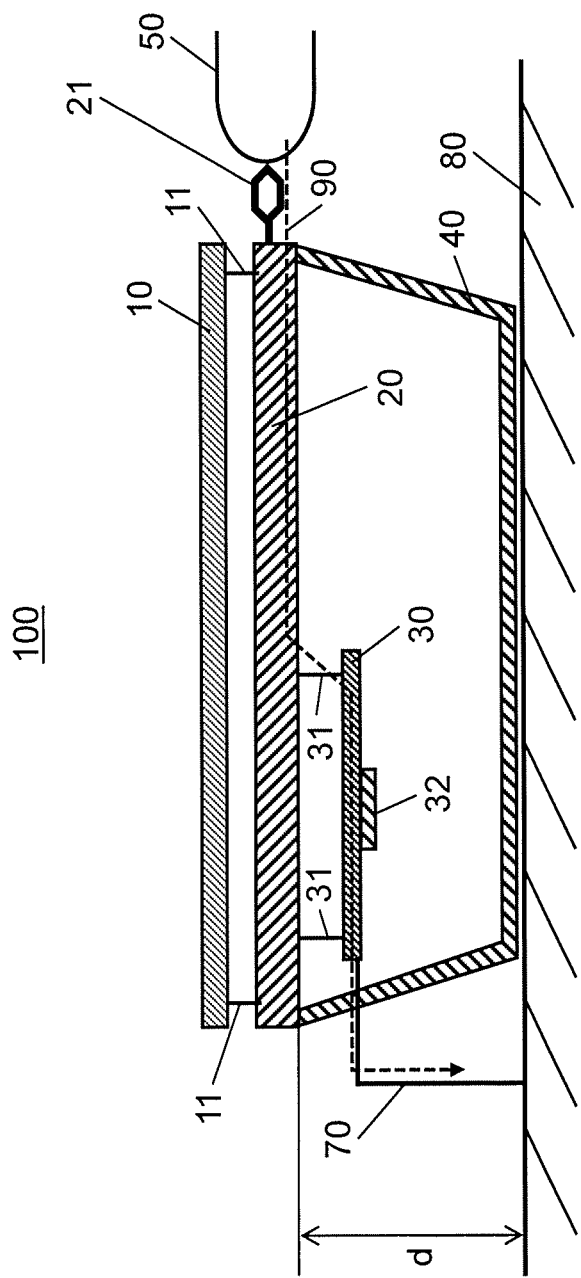
FIG. 1 is a cross-sectional diagram of a conventional tablet.

Hereinafter, referring to the drawings as needed, exemplary embodiments will be described in detail. However, more detailed description than necessary may be omitted. For example, detailed description of well-known items or overlapping description of substantially the same constitutions may be omitted. This is to avoid making the following description more redundant than necessary, and to facilitate understanding of those in the art.

The accompanying drawings and the following description are provided so that those in the art can sufficiently understand the present disclosure, and are not intended to limit subject matters described in claims.

First Exemplary Embodiment

[1-1. Problem]

Figure 2:
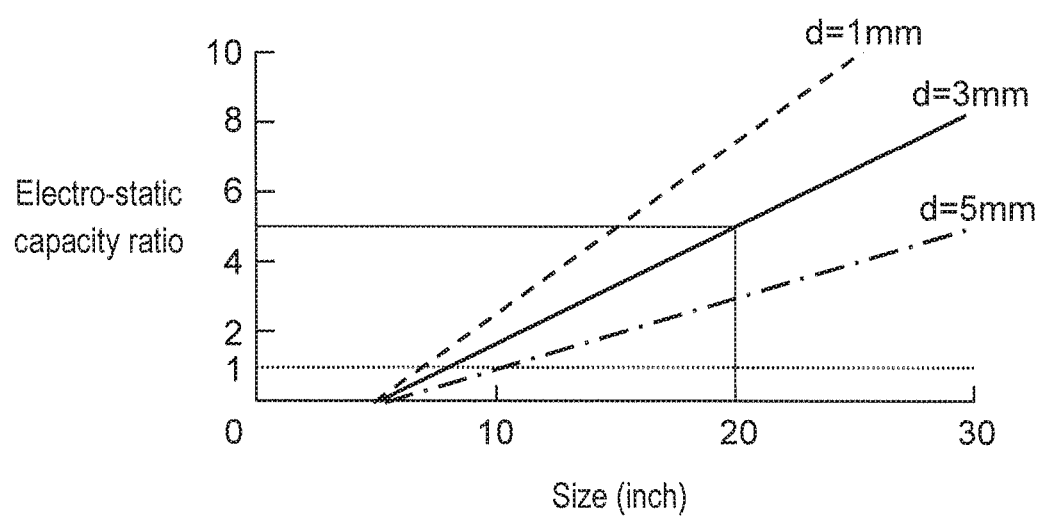
FIG. 2 is a graph showing a relationship between a size of the tablet and an electro-static capacity ratio.

Firstly, a problem of electro-static discharge in a large-screen tablet will be described with reference to FIGS. 1 and 2. FIG. 1 is a cross-sectional diagram of a conventional tablet. FIG. 2 is a graph showing a relationship between a size of the tablet and an electro-static capacity ratio.

In a mobile electronic device including a tablet, an electro-static current flows into a printed circuit board inside the electronic device from a housing by electro-static discharge when a user touches the electronic device or the like, an electric potential between a power supply and a ground of the printed circuit board fluctuates, which may cause malfunction such as occurrence of reset of a CPU (Central Processing Unit) mounted on the printed circuit board and occurrence of flicker in a screen of an LCD (Liquid Crystal Display) panel of the tablet.

In FIG. 1, tablet 100 is made up of display module 10 including an LCD panel and a drive circuit of the LCD panel, magnesium first metal frame 20, stainless steel security hook 21 connected to first metal frame 20 and having a wire for theft prevention attached thereto, and, printed circuit board 30 made of a glass epoxy substrate and mounting CPU 32, which is an electronic circuit used in tablet 100, and resin exterior 40 made of grass-fiber reinforced plastic to store printed circuit board 30 inside Display module 10 and first metal frame 20 are connected by connection portions 11. Printed circuit board 30 and first metal frame 20 are connected by connection portions 31 as conductive members, and the ground of printed circuit board 30 is electrically connected to first metal frame 20.

Tablet 100 has a secondary battery built-in, which secondary battery not shown, is made of, for example, a lithium-ion battery. In order to charge this secondary battery or to operate tablet 100 by an external power supply, detachable power cable 70 is included.

In FIG. 1, tablet 100 is placed on metal table 80. A distance between first metal frame 20 and metal table 80 is defined as d.

In tablet 100, finger 50 touches stainless steel security hook 21 as the conductive member, which is connected to first metal frame 20, and this generates static electricity, and generated electro-static current 90 flows to first metal frame 20, flows to printed circuit board 30 through connection portions 31, and flows to the ground through power cable 70. Electro-static current 90 flows in printed circuit board 30, and also flows in CPU 32 on printed circuit board 30. When electro-static current 90 flowing in CPU 32 becomes large, malfunction of CPU 32 is caused.

In FIG. 2, a horizontal axis indicates a size of the LCD panel of display module 10 of tablet 100, and a vertical axis indicates an electro-static capacity ratio to a reference. As the reference, the electro-static capacity generated when the size of the LCD panel is 10 inches and distance d between first metal frame 20 and metal table 80 is 5 mm is defined as 1. In FIG. 2, in cases where distance d is 1 mm, 3 mm, and 5 mm, the size of the LCD panel and the electro-static capacity ratio to the reference are shown.

Here, electro-static current i and electro-static capacity C formed between metal table 80 and first metal frame 20 have the following relationship, using frequency ω and voltage V.

$$i = j\omega CV.$$

Furthermore, in electro-static capacity C, and facing area S and distance d between metal table 80 and first metal frame 20, the following expression is established if ∈0 is a dielectric constant of air.

$$C = \in 0 (S/d)$$

That is, the following expression is established.

$$|\propto (S/d)$$

Facing area S increases, that is, the size of the LCD panel becomes large, and distance d decreases. That is, when tablet 100 is increased in size or decreased in thickness, electro-static current i is increased. In FIG. 2, for example, when the size is 20 inches, and distance d is 3 mm, the electro-static capacity becomes about five times as large as the reference.

In this manner, the size of tablet 100 is increased to 20 inches or more, or the thickness of tablet 100 is decreased in an electric/mechanical design application, in an educational application, or the like, and consequently, an amount of the electro-static current flowing into CPU 32 and the like is increased, thereby causing malfunction, so that the problem of the static electricity becomes more serious.

Moreover, as to the electro-static discharge, an immunity essential condition and a test method of an electronic device against the electrostatic discharge generated directly from a charged operator or by a charged proximal object are defined in IEC61000-4-2 stipulated by International Electrotechnical Commission (IEC). The static electricity is applied to the electronic device from an electro-static gun as an ESD generator that simulates a phenomenon in which electrical charge accumulated in an operator is discharged toward the electronic device in an environment of a low humidity or in a condition where chemical fiber carpet or clothes are used. Tablet 100 needs to clear the test stipulated in IEC61000-4-2.

[1-2. Constitution]

Figure 3:
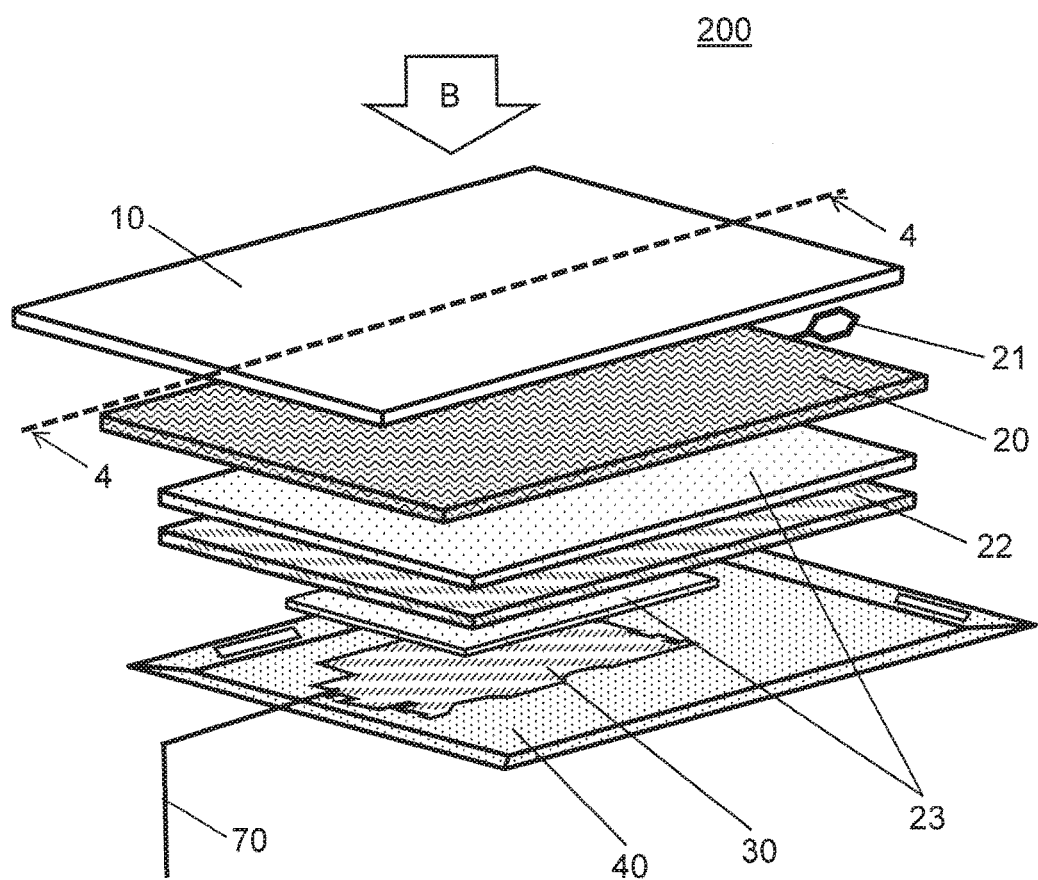
FIG. 3 is an exploded perspective diagram of a tablet according to a first exemplary embodiment.
Figure 4:
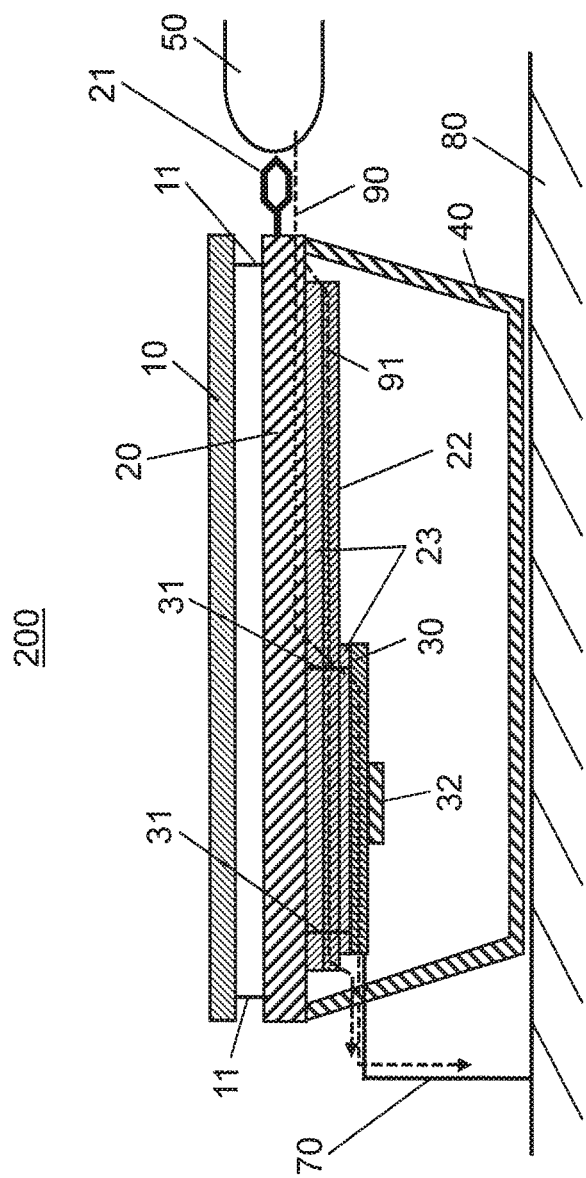
FIG. 4 is a cross-sectional diagram along 4-4 in FIG. 3.
Figure 5:
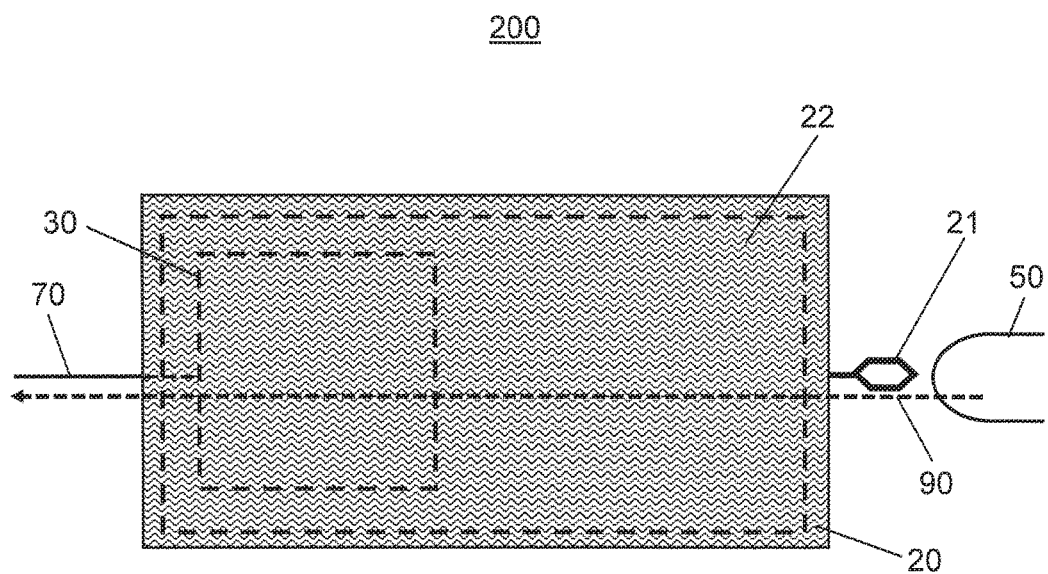
FIG. 5 is a diagram when seen from a B direction in FIG. 3.

FIG. 3 is an exploded perspective diagram of a tablet in the first exemplary embodiment, FIG. 4 is a cross-sectional diagram along 4-4 in FIG. 3, and FIG. 5 is a diagram when seen from a B direction in FIG. 3.

Tablet 200 is different from tablet 100 in including a diversion structure of the electro-static current made up of first metal frame 20 and second metal frame 22. The size of tablet 100 is 20 inches, and a thickness is 12.5 mm.

Tablet 200 is made up of display module 10 including an LCD panel and a drive circuit thereof, magnesium first metal frame 20, stainless steel security hook 21 connected to first metal frame 20, and having a wire for theft prevention attached thereto, and printed circuit board 30 made of a glass epoxy substrate and mounting CPU 32, second metal frame 22, insulating members 23, and resin exterior 40 that stores printed circuit board 30 inside. Tablet 200 includes the diversion structure of the electro-static current made up of first metal frame 20 and second metal frame 22, which diversion structure will be described later. Printed circuit board 30 is disposed apart from security hook 21, which will be an electro-static source.

In FIG. 4, tablet 200 is placed on metal table 80.

Display module 10 and first metal frame 20 are connected by connection portions 11. Printed circuit board 30 and first metal frame 20 are connected by connection portions 31, and a ground of printed circuit board 30 is electrically connected to first metal frame 20.

Tablet 200 has a secondary battery built-in, which secondary battery not shown, is made of, for example, a lithium-ion battery In order to charge this secondary battery or to operate tablet 200 by an external power supply for example, detachable power cable 70 is included.

In tablet 200, second metal frame 22 made of a copper foil having a thickness of 35 μm is disposed between printed circuit board 30 and first metal frame 20 with insulating member 23 interposed, insulating member 23 being made of a polycarbonate plate having a thickness of 1 mm.

In FIG. 5, an area of second metal frame 22 is smaller than the area of first metal frame 20, and second metal frame 22 is larger on a security hook 21 side, which is an upstream side of electro-static current 90, than printed circuit board 30, and is also larger on a power cable 70 side, which is downstream side of electro-static current 90.

The area of second metal frame 22 may be the same as the area of first metal frame 20.

[1-3. Operation]

Next, propagation operation of the electro-static current flowing in tablet 200 will be described.

In FIG. 4, finger 50 touches security hook 21, which generates static electricity, and electro-static current 90 flows to first metal frame 20, and diverges into electro-static current 91 in second metal frame 22 by electromagnetic field coupling between first metal frame 20 and second metal frame 22. Since electro-static current 90 diverges into electro-static current 91, electro-static current 90 is reduced in magnitude, flows to printed circuit board 30 through connection portions 31 between printed circuit board 30 and first metal frame 20, and flows to the ground through power cable 70. This can suppress the electro-static current flowing to CPU 32 on the printed circuit board.

[1-4. Effects]

Figure 6:
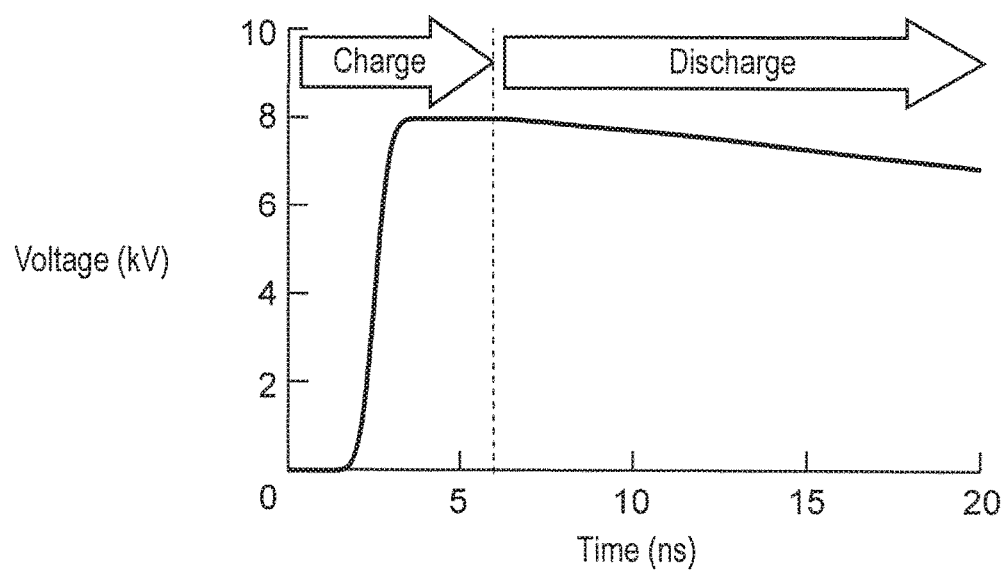
FIG. 6 is a characteristic diagram showing a test waveform stipulated. in IEC61000-4-2 of an electro-static gun.
Figure 7A:
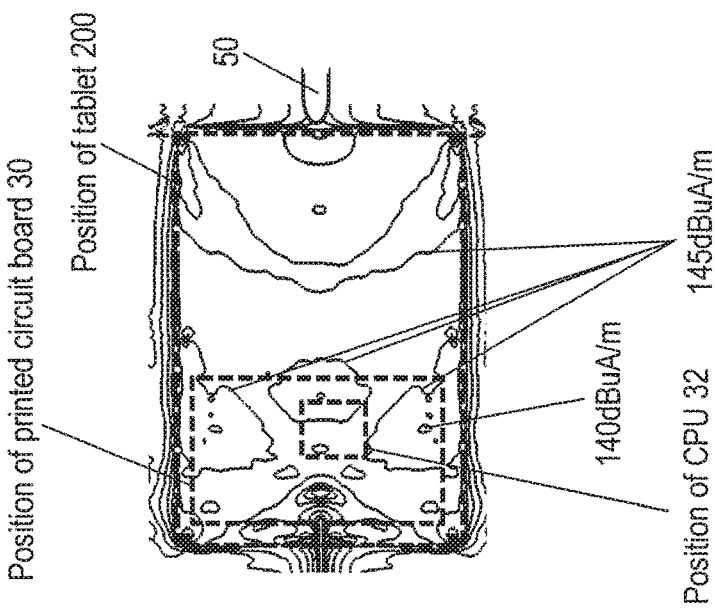
FIG. 7A is a diagram showing an analysis result of electro-static current distribution with respect to the conventional tablet.
Figure 7B:
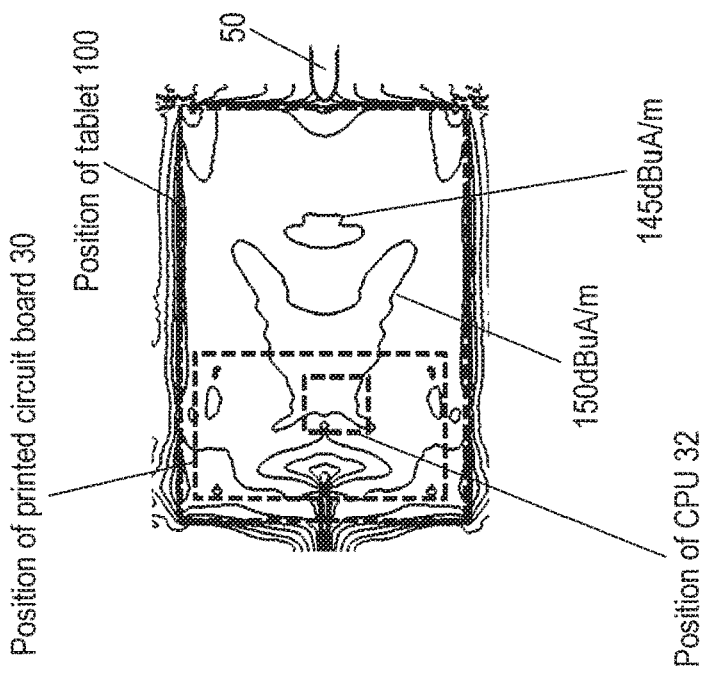
FIG. 7B is a diagram showing an analysis result of electro-static current distribution with respect to the tablet according to the first exemplary embodiment.

Electro-static current distribution is analyzed with respect to tablets 100, 200. FIG. 6 is a characteristic diagram showing a test waveform stipulated in IEC61000-4-2 of the electro-static gun. In FIG. 6, a horizontal axis indicates time, and a vertical axis indicates a test waveform which is an electro-static voltage. FIG. 7A is a diagram showing an analysis result of the electro-static current distribution with respect to tablet 100 not including the diversion structure of the electro-static current, and FIG. 7B is a diagram showing an analysis result of the electro-static current distribution with respect to tablet 200 including the diversion structure of the electro-static current. In this electro-static analysis, magnetic field distribution when the static electricity is applied to security hook 21 of each of tablets 100, 200 is calculated by a finite-difference time-domain (FDTD) method, which is a numerical calculation method resulting in algorithm of Yee in which Maxwell's equation is directly differentiated with both time and space coordinates with respect to an analysis area of three-dimensional space including an air area, and electromagnetic field distribution from an excitation source is sequentially calculated. The space is divided into about 8,600,000 gratings, and calculation is performed in about 80,000 steps in units of about 0.247 ps for a time of totally 20 ns. A model of the electrostatic gun applies the static electricity to tablets 100, 200 to be analyzed by charging electrical charge for 6 ns to obtain 8 kV, and after this, discharging the electricity, as shown in FIG. 6.

FIGS. 7A and 7B each show magnetic field intensity distribution indicating intensity of the electro-static current at a time of 8 ns. FIG. 7A shows that with respect to tablet 100, the static electricity is applied from a right side in the drawing, and the electro-static current generating a magnetic field of up to 150 dBµA/m flows at a position of CPU 32 mounted on printed circuit board 30. FIG. 7B shows that with respect to tablet 200, the static electricity is applied from a right side in the drawing, and the electro-static current generating a magnetic field of up to 145 dBµA/m flows at a position of CPU 32 mounted on printed circuit board 30. Accordingly, in tablet 200 including the diversion structure of the electro-static current, the electro-static current that generates a magnetic field of about 5 dBµA/m in CPU 32 is suppressed as compared with tablet 100 riot including the diversion structure of the electro-static current.

As described above, the tablet of the present exemplary embodiment includes display module 10, first metal frame 20 holding display module 10, second metal frame 22 disposed on a surface opposite to a surface of first metal frame 20 where display module 10 is held, and printed circuit board 30 having the ground electrically connected to first metal frame 20, mounting CPU 32 which is the electronic circuit, and disposed on a surface opposite to a surface of second metal frame 22 where first metal frame 20 is disposed. The electro-static current diverges to the first metal frame and the second metal frame.

This enables to reduce influence to tablet 200 by the electro-static discharge only by providing the diversion structure of the electrostatic current made up of first metal frame 20 and second metal frame 22 without adding a structure for static electricity suppression to printed circuit board 30 and CPU 32.

While in the present exemplary embodiment, the diversion structure of the electro-static current has been described with the first metal frame and the second metal frame, the present disclosure is not limited thereto. For example, not only the first metal frame and the second metal frame but three or more metal frames may be used to make up the diversion structure of the electro-static current.

While in the present exemplary embodiment, the tablet to which the power cable is connected has been described, the tablet is not connected to the power cable but the tablet uses a charged secondary battery.

While in the present exemplary embodiment, it has been described. that the static electricity is generated by a finger touching the security hook, the electro-static source is not limited thereto. The static electricity may be generated by a charged user touching a conductive member projected in the exterior of the tablet, or a conductive member inside a hole provided in the exterior directly or through a proximate object.

[1-5. Modifications]

Figure 8:
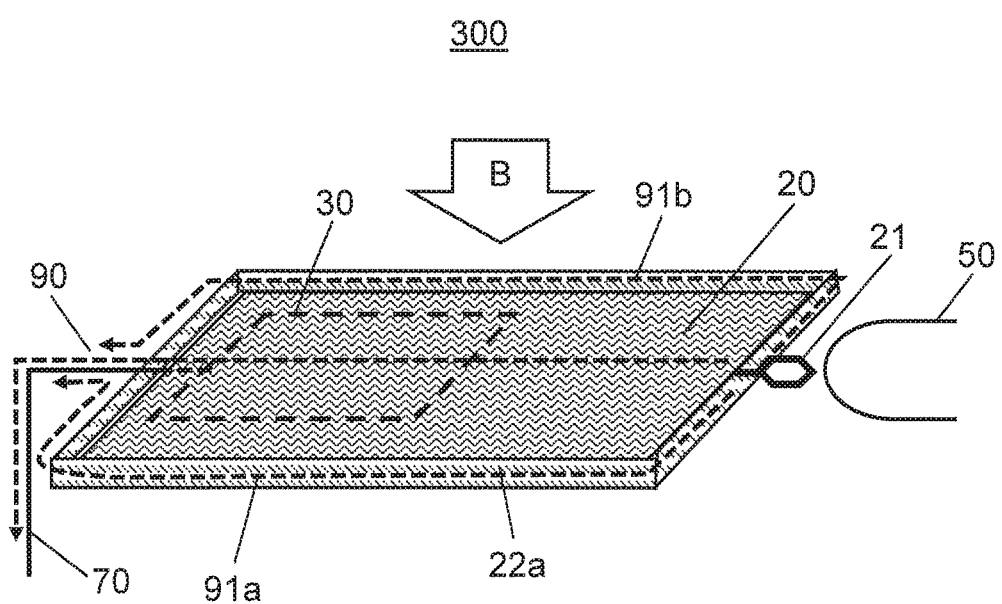
FIG. 8 is a diagram showing another diversion structure of an electro-static current of the tablet of the first exemplary embodiment.
Figure 9:
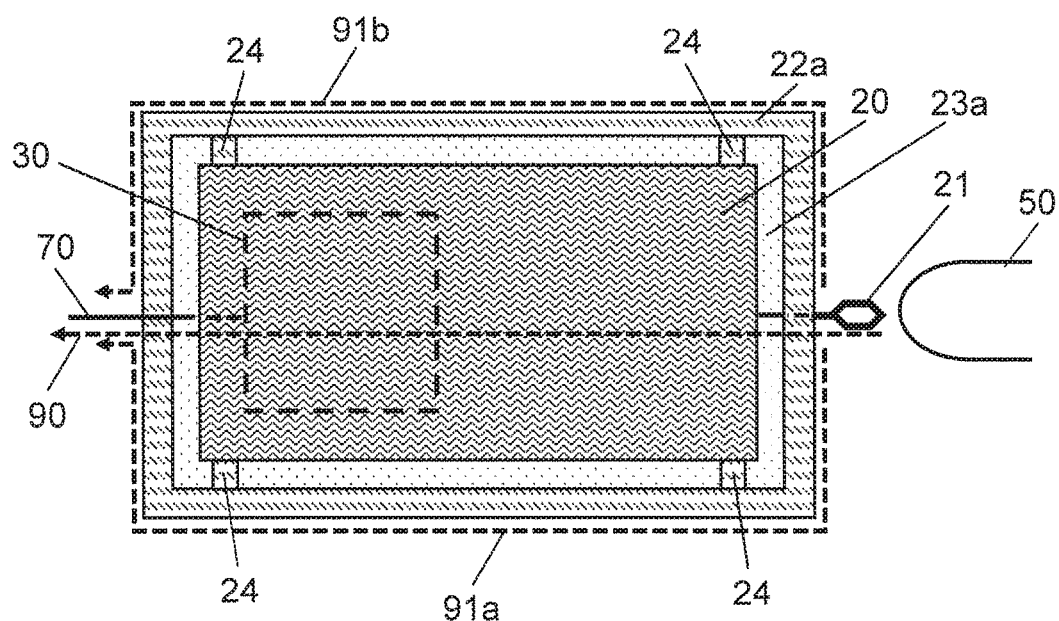
FIG. 9 is a diagram when seen from a B direction in FIG. 8.

Next, modifications of the diversion structure of the electro-static current will be described. FIG. 8 is a diagram showing a diversion structure of an electro-static current of tablet 300, and FIG. 9 is a diagram when seen from a B direction of FIG. 8. In FIGS. 8 and 9, only a main constitution of the diversion structure of the electro-static current is shown, and display module 10, resin exterior 40 and the like are omitted. Second metal frame 22a is disposed around first metal frame 20 through four inter-metal frame bridge portions 24.

A number of inter-metal frame bridge portions 24 is not limited to four. The number of inter-metal frame bridge portions 24 only needs to be two or more.

A gap between second metal frame 22a and first metal frame 20 is filled with insulating member 23a made of polycarbonate having a thickness of 1 mm, and in second metal frame 22a disposed in a vicinity of first metal frame 20, electro-static current 90 diverges into electro-static currents 91a, 91b by electromagnetic field coupling between first metal frame 20 and second metal frame 22a. Since electro-static current 90 diverges into electro-static currents 91a, 91b, electro-static current 90 is reduced in magnitude, flows to printed circuit board 30 through connection portions 31 between printed circuit board 30 and first metal frame 20, and flows to a ground through power cable 70. This suppresses the electro-static current in CPU 32 on printed circuit board 30.

Insulating member 23a between second metal frame 22a and first metal frame 20 may be a slit.

While second metal frame 22a is connected to first metal frame 20 by inter-metal frame bridge portions 24, inter-metal frame bridge portions 24 are not necessarily required.

Figure 10:
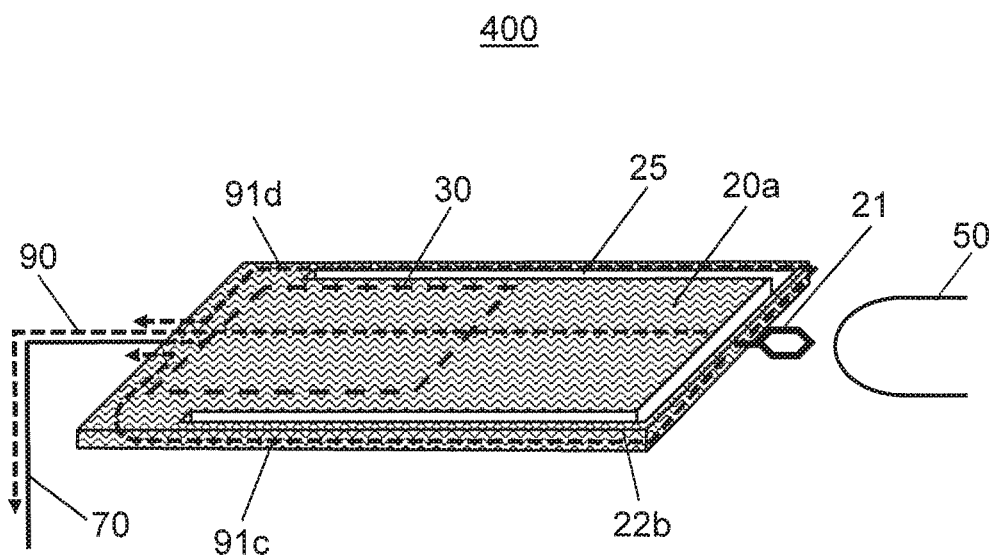
FIG. 10 is a diagram showing still another diversion structure of the electro-static current of the tablet of the first exemplary embodiment.

Next, another modification of the electro-static diversion structure will be described. FIG. 10 is a diagram showing a diversion structure of an electro-static current of tablet 400. In FIG. 10, only a main constitution of the diversion structure of the electro-static current is shown, and display module 10, resin exterior 40 and the like are omitted. Slit 25 is formed around first metal frame 20a.

Slit 25 has a width of, for example, 1 mm, and slit 25 separates first metal frame 20a into first metal frame 20a inside slit 25, and second metal frame 22b outside slit 25 from each other.

Finger 50 touches security hook 21, which generates static electricity, and electro-static current 90 flows to first metal frame 20a and diverges into electro-static currents 91c, 91d in second metal frame 22b by electromagnetic field coupling on both sides of slit 25. Since electro-static current 90 diverges into electro-static currents 91c, 91, electro-static current 90 is reduced in magnitude, flows to printed circuit board 30 through connection portions 31 between printed circuit board 30 and first metal frame 20a, and flows to the ground through power cable 70. This suppresses the electro-static current flowing in CPU 32 on printed circuit board 30.

Slit 25 may be filled with a dielectric material such as polycarbonate or the like.

While in the present exemplary embodiment, the tablet having the display module using the LCD panel has been described, the present disclosure is not limited thereto. The present disclosure can be applied to a tablet having another display panel of an organic EL (electroluminescence) and the like.

The present disclosure can be applied to a tablet type electronic device which can be placed on a metal table to be used. As the tablet type electronic device, specifically, the present disclosure can be applied to a tablet, a smartphone or the like.

What is claimed is:

1. An electronic device comprising:
a display module;
a first metal frame that holds the display module;
a second metal frame disposed on a surface opposite to a surface of the first metal frame where the display module is held;
a printed circuit board having a ground electrically connected to the first metal frame, mounting an electronic circuit, and disposed on a surface opposite to a surface of the second metal frame where the first metal frame is disposed;
an exterior that stores the printed circuit board inside; and
a conductive member connected to the first metal frame, and projected from the exterior or disposed inside a hole provided in the exterior,
wherein the printed circuit board is connected to the surface opposite to the surface of the second metal frame where the first metal frame is disposed so that an electro-static current diverges to the first metal frame and the second metal frame.

2. The electronic device according to claim 1, wherein the printed circuit board is disposed apart from the conductive member.

3. The electronic device according to claim 1, wherein a size of the second metal frame is not larger than a size of the first metal frame, and the second metal frame is at least larger on a side of the conductive member than the printed circuit board.

4. An electronic device comprising:
a display module;
a first metal frame that holds the display module;
a printed circuit board having a ground electrically connected to the first metal frame, mounting an electronic circuit, and disposed on a surface opposite to a surface of the first metal frame where the display module is disposed, wherein the first metal frame is disposed in at least a part of a second metal frame with an insulating member or a slit interposed;
an exterior that stores the printed circuit board inside; and
a conductive member connected to the first metal frame, and projected from the exterior or disposed inside a hole provided in the exterior,
wherein an electro-static current diverges to the first metal frame and the second metal frame.

* * * * *